(12) United States Patent
Tzeng et al.

(10) Patent No.: US 7,241,099 B2
(45) Date of Patent: Jul. 10, 2007

(54) CENTER BALL O-RING

(75) Inventors: Huan-Liang Tzeng, Hsinchu (TW); Jeng-Horng Hsieh, Tou Fen Township, Miaol County (TW); Jung-Hsiang Chang, Hsin-chu County (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 286 days.

(21) Appl. No.: 10/762,165

(22) Filed: Jan. 21, 2004

(65) Prior Publication Data

US 2005/0155709 A1 Jul. 21, 2005

(51) Int. Cl.
*B65H 1/00* (2006.01)

(52) U.S. Cl. ............... 414/222.07; 414/941; 277/637; 277/644; 277/910; 156/345.31; 156/345.51; 118/719; 118/729; 118/503

(58) Field of Classification Search .......... 156/345.31, 156/345.32, 345.51; 118/719, 500, 728, 118/729; 277/910, 543, 637, 640, 644; 414/935–941, 414/222.07

See application file for complete search history.

(56) References Cited

U.S. PATENT DOCUMENTS

| | | | |
|---|---|---|---|
| 3,167,322 A | * | 1/1965 | Aichroth ..................... 277/453 |
| 4,923,584 A | | 5/1990 | Bramhall, Jr. et al. .. 204/298.25 |
| 5,522,975 A | | 6/1996 | Andricacos et al. .... 204/297 R |
| 6,214,119 B1 | | 4/2001 | Maher et al. ............... 118/719 |
| 6,981,704 B2 | * | 1/2006 | Okazaki et al. ............. 277/638 |

* cited by examiner

Primary Examiner—Karla Moore

(57) ABSTRACT

A self-retaining O-ring having at least two radial struts connectively extending from inside surfaces to a central sphere-shaped retainer. The top surfaces of the radial struts are formed below the top surfaces of the O-ring. The central sphere-shaped retainer is connectively formed to the radial struts and extending below the bottom surfaces of the struts. A circular recess is provided for containing and supporting the O-ring, its inside surface is dovetailed. The circular recess has a spherical hole disposed on its center for insertion of the sphere-shaped retainer.

29 Claims, 4 Drawing Sheets

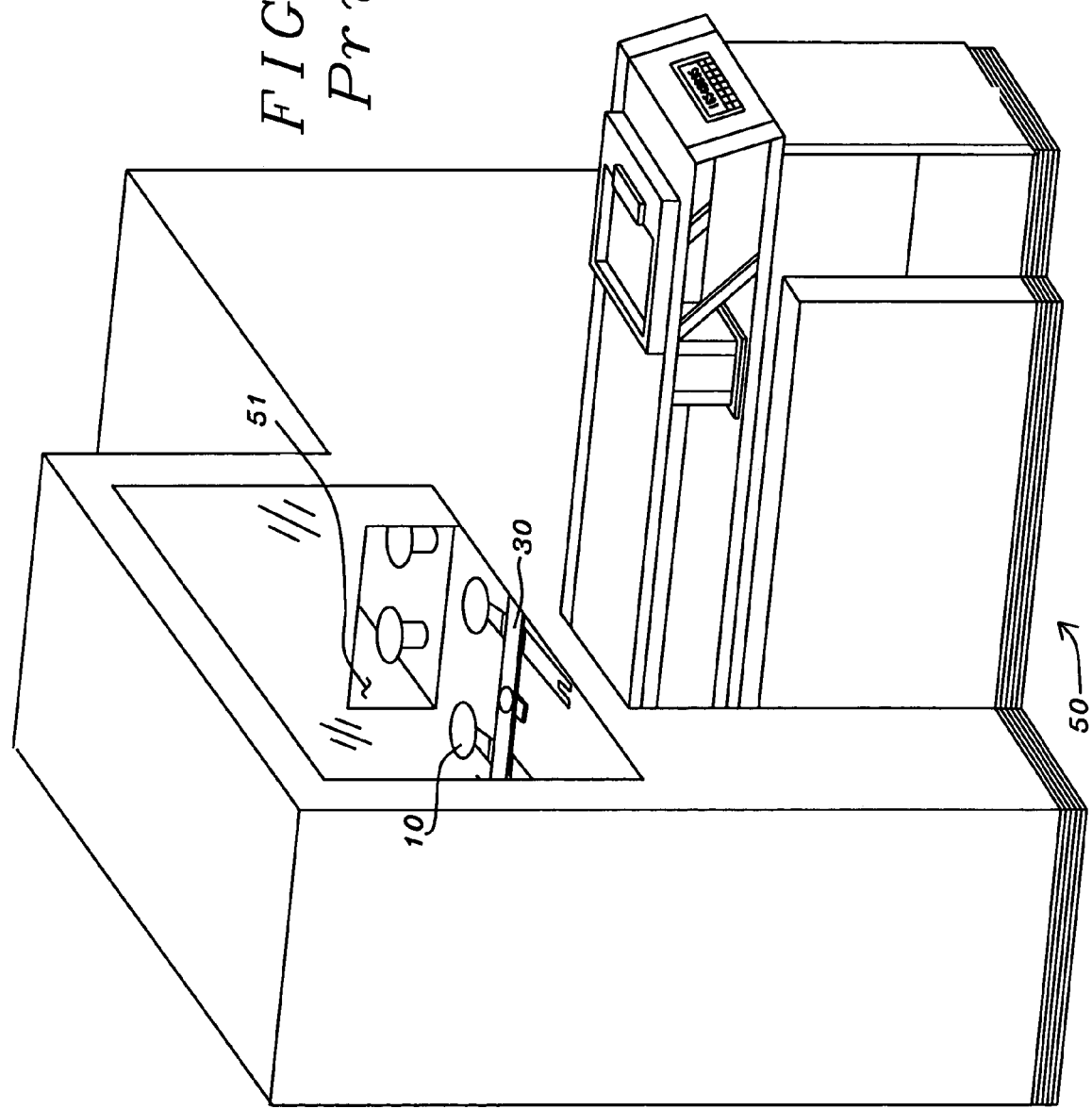
FIG. 1 – Prior Art

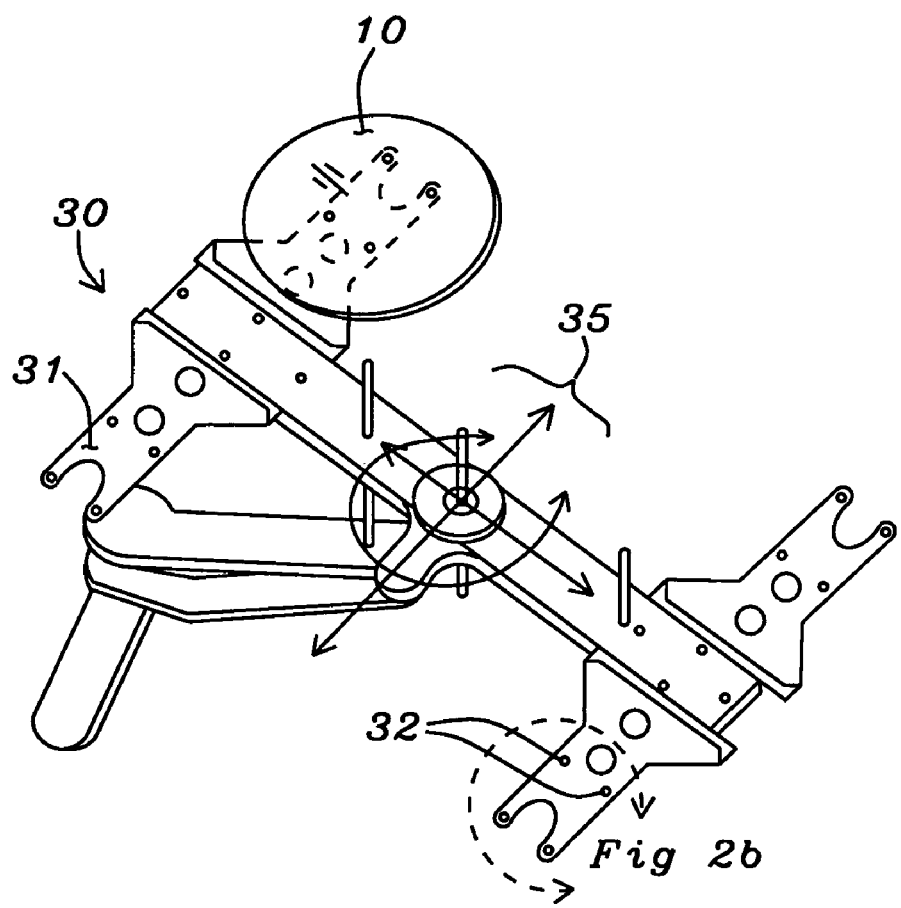
FIG. 2a - Prior Art
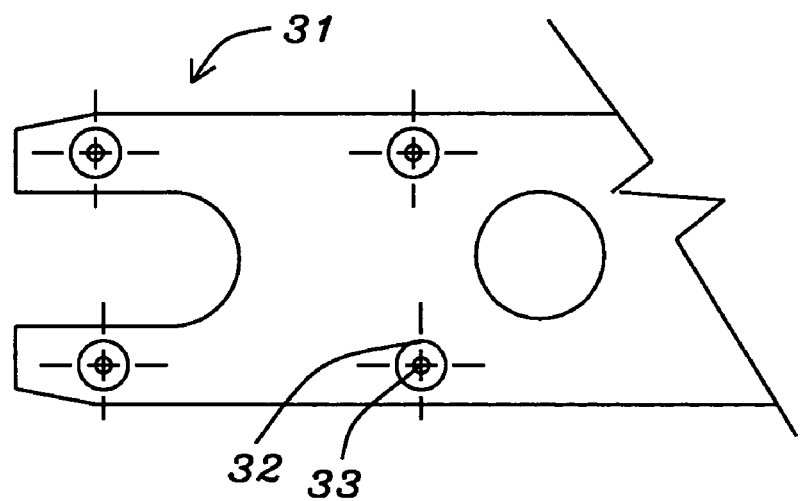
FIG. 2b

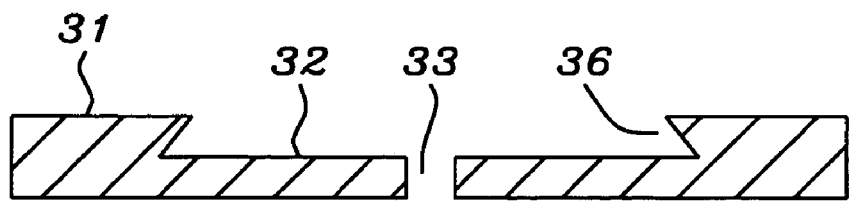
FIG. 3 - Prior Art
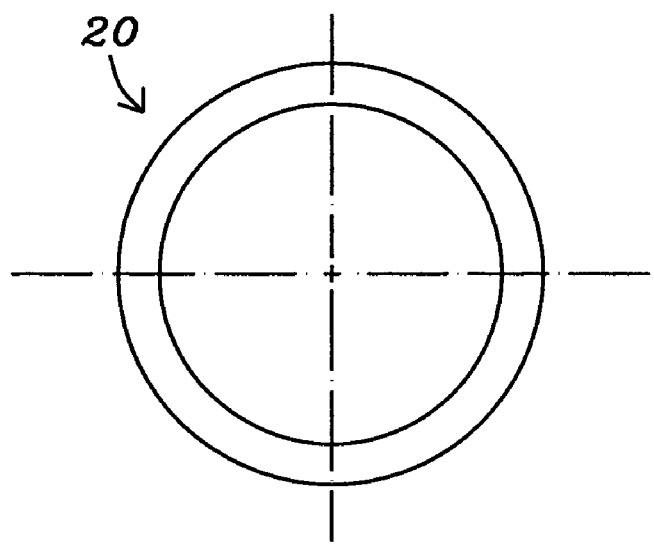
FIG. 4 - Prior Art
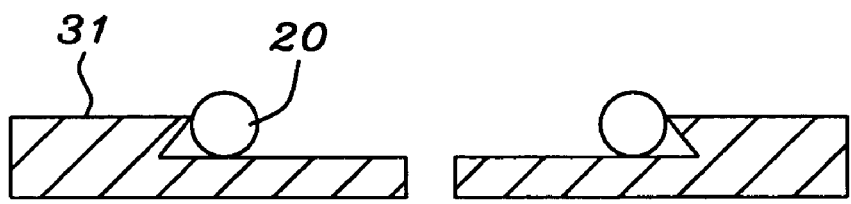
FIG. 5 - Prior Art

CENTER BALL O-RING

BACKGROUND OF THE INVENTION

1. Technical Field

This invention relates generally to substrate transfer and handling apparatus and more particularly to improvements to a mechanism for releasably transferring a substrate to and from a processing machine.

2. Description of the Prior Art

With the existence of high throughput process equipment, automatic substrate handling is most essential. The need for higher yield in the manufacture of semiconductor devices has driven the development and use of more highly automated semiconductor substrate handling apparatus. Furthermore, the need to reduce particulate levels in the processing areas have demanded the use of controlled substrate containment in which substrate transfer occurs. Traditional tooling front-ends, in which substrate transfer handling occurs, have historically involved labor-and time-intensive integration of multiple components-atmospheric wafer-handling robotics, load-ports, wafer identification and tracking readers, mini-environments, control software—to form an ever increasing complex of front-end tooling. Chip manufacturers are seeking less complicated, highly reliable and more serviceable equipment solutions. This is due to the relatively high cost of down time in semiconductor facilities.

Prior art provides a substrate transfer apparatus that is simple, which reduces particulate generation, and is somewhat reliable. The substrate-transporting robot must be exacting in its handling of the fragile substrate. Horizontal positioning is difficult to control as distances increase particularly with increasing substrate sizes and chamber dimensions. Shifting of a substrate while being supported on a transfer paddle causes a substrate to be out of its expected position on the paddle. Shifting occurs during movement if a friction pad is missing on the top surface of a paddle. This problem can generate particulate contaminates as well as breakage because of interference with stationary members. The prior art handler does not provide anticipated reliability during the transfer operation.

DESCRIPTION OF THE INVENTION

The fabrication of semiconductor devices is normally carried out at the substrate level. Disk-like substrates of semiconductor material comprising a relatively large number of individual devices proceed through the various manufacturing processes before being separated into individual die which each contain a single device, such as a memory or microprocessor chip. The need for higher yield manufacturing steps leads to more automated substrate processing systems which can process a larger number of substrates per day and within a cleaner process environment. Completing each process step as a cost-effective operation depends greatly on the reliability of each operating element within the processing system.

In view of the prior art, it is a principle object of the present invention to provide an improved design for a friction pad presently used on the transfer paddle for releasably supporting and transferring a substrate within a substrate-processing machine.

A further object of the present invention is to provide an efficient and reliable means for receiving the substrate from a substrate transport device while maintaining a substrate position.

It is another object of the present invention to provide an efficient and reliable means for presenting and releasing the substrate to a substrate transport device without generating particulate contamination.

It is still another object of the present invention to provide an O-ring that is reliably designed to remain on the paddle thereby preventing shifting of a substrate during transfer.

These objects of the invention and other objects, features, and advantages to become apparent as the specification progresses are accomplished by the invention, according to which, briefly stated, an O-ring that is shaped to be retained by plug ably inserting a central spherical member that is molded as part of the O-ring.

These and further constructional and operational characteristics of the invention will be more evident from the detailed description given hereafter with reference to the figures of the accompanying drawings which illustrate preferred embodiments and alternatives by way of non-limiting examples.

DESCRIPTION OF THE DRAWINGS

FIG. 1 is a perspective depiction of a front-end tool of the prior art.

FIG. 2a is a perspective top view of a substrate paddle handler with an enlarged view shown in FIG. 2b, of the prior art.

FIG. 3 is an enlarged cross-section view of an O-ring groove that is used on a substrate paddle handler of the prior art.

FIG. 4 is an enlarged top view of an O-ring that is used with the substrate paddle handler, of the prior art.

FIG. 5 is an enlarged cross-section view of an O-ring placed in a substrate paddle of the prior art.

DETAILED DESCRIPTION OF THE PREFERRED EMBODIMENT

Figure 6:
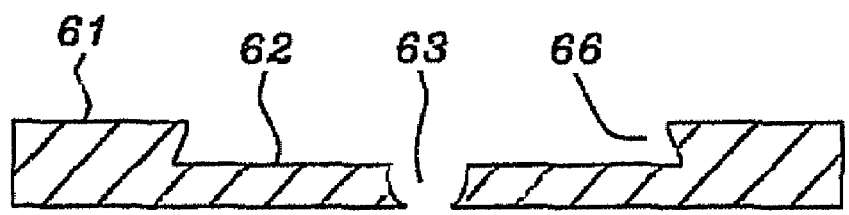
FIG. 6 is an enlarged cross-section view showing an O-ring groove that is used on a substrate paddle handler according to the invention.

The fabrication of semiconductor devices, containing highly integrated logic and memory circuits, is normally carried out at the substrate level. Large diameter, disc like substrates of semiconductor material comprising a relatively large array of individual devices proceed through the various manufacturing processes before being separated into individual devices, such as a memory or microprocessor chip. The need for higher yield manufacturing steps leads to more automated substrate processing systems which can process a larger number of substrates per day and within a cleaner process environment. Conventional tooling front-ends, in which substrate transfer handling occurs, have historically involved labor-and time-intensive integration of multiple components—atmospheric wafer-handling robotics, load-ports, wafer identification and tracking readers, mini-environments, control software—to form an ever increasing complex of front-end tooling. FIG. 1 illustrates a "state of the art" modular front-end processing tool 50 showing a substrate paddle handling robot 30 used for transferring semiconductor substrates 10 to and from a process chamber 51. Chip manufacturers are seeking highly reliable and more serviceable equipment solutions. This is due to the relatively high cost of down time in semiconductor facilities. Completing each process step as a cost-effective operation depends greatly on the reliability of each operating element within the processing system.

FIG. 2a shows a substrate paddle handling robot 30 and an enlarged fragmented view of a paddle shown in FIG. 2b. The paddle handler robot is used to transfer substrates 10 to and from a process chamber, as previously described. Ramped accelerations and decelerations prevent substrates from shifting while resting on the paddle 31, even as they are moved at a very fast pace. This is partly due to the controlled motions and, partly because of frictional contact between the underside of the substrate and rest pads retained by grooves 32 disposed on the paddle 31.

FIGS. 3, 4, and 5 show the method of application for the O-ring rest pads 20 used by the prior art. FIG. 3 illustrates a partial cross-section view of a recess 32 for inserting the O-ring within the recess retained by the dovetail profile 36. A through hole 33 is disposed on center of the recess 32. FIG. 4 shows an elastomeric O-ring 20 that is placed within the recess 32 while being retained by the dovetailed recess shown in FIG. 5 of the prior art.

Periodically, the O-ring, of the prior art, sticks to the under side of a substrate as the substrate is being lifted for transfer and dropped somewhere within the transfer chamber. This causes a cumulative effect. Placing a substrate 10, for example, on a conveying surface with an O-ring stuck to its underside, may cause damage to the substrate during processing. Moreover, when a substrate is placed on a paddle 31 with a missing O-ring, the transfer speed of the handler robot 30 may cause shifting of the substrate on the paddle-resting surface. When this occurs, the substrate would be out of position for further handling, thereafter, resulting in chipping or even breaking of substrates before the problem is detected.

Figure 7:
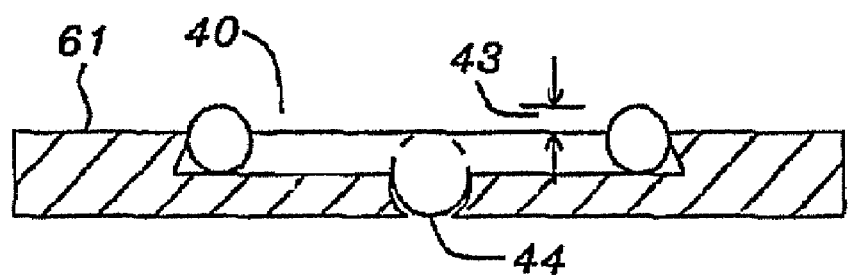
FIG. 7 is an enlarged cross-section of an O-ring placed in a substrate paddle, according to the invention.
Figure 8:
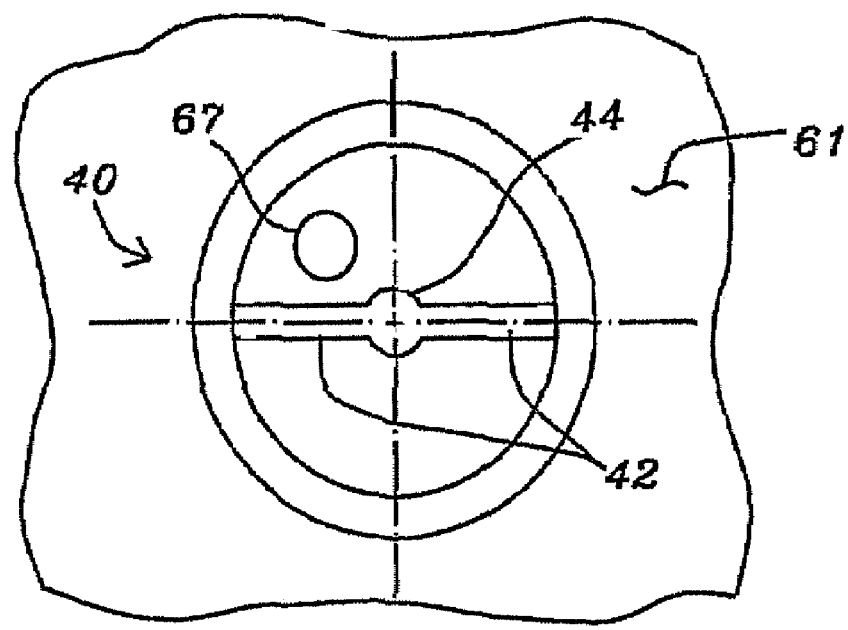
FIG. 8 is a fragmented top view of an O-ring embodiment placed in an O-ring groove disposed on a substrate paddle according to the invention.

Referring now to FIGS. 6, 7, and 8 illustrating a device, according to the invention, that prevents the type of problems described in the previous paragraph. FIG. 6 shows a partial cross-section view of a paddle 61. A recess 62 with a dovetail form 66 is similar to the recess of the prior art. However, a center hole 63 having a spherical shaped sidewall is used instead of a straight walled hole 33 that is used in the prior art. This was illustrated in FIGS. 3 and 5.

FIGS. 7 and 8 illustrate a self-retaining O-ring 40 that removeably secures it-self to a recess 62 formed in paddle 61, thereby, preventing the self-retaining O-ring, according to the invention, from being lifted as a result of being stuck to the bottom of an object that is being removed. The self-retaining O-ring 40 has two radial members 42 extending radially from the inside surface of the O-ring to a spherical retainer 44 disposed on the central axis of O-ring 40. FIG. 7 shows a cross-section of the self-retaining O-ring 40 illustrating the spherical retainer 44 is formed below the horizontal bottom surfaces of radial members 42. The spherical retainer 44 is urged into spherical formed hole 63, making the bottom surfaces of the radial members contiguous with recess surface 62. The upper surfaces of the radial members are formed below the upper supporting surface of the O-ring 40. This is shown by dimension 43.

Another embodiment of a recess 62 includes a vent hole 67 for exhausting trapped air between the bottom of an object and the supporting surface of the O-ring 40. Hole 67 can also be used to draw a vacuum to urge an object against the O-ring supporting surface.

In summary, a self clutching O-ring having at least two radial struts connectively extending from inside surfaces to a central sphere-shaped retainer. The top surfaces of the radial struts are formed below the top surfaces of the O-ring. The central sphere-shaped retainer is connectively formed to the radial struts and extending below the bottom surfaces of the struts. A circular recess is provided for containing and supporting the O-ring, its inside surface is dovetailed. The circular recess has a spherical hole disposed on its center for urging the insertion of the sphere-shaped retainer.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    an O-ring structure having at least two internally disposed struts, each strut extending to a centrally disposed sphere retainer, the struts having an upper surface and a lower surface; and
    said sphere retainer formed so that it is connected to said struts, and wherein a lower portion of said sphere retainer extends below the lower surface of the struts.

2. The apparatus of claim 1, further comprising:
    a structure having a recess for supporting and containing the O-ring, the recess having a spherical hole disposed on its center for removeably inserting said lower portion of said sphere retainer.

3. The apparatus of claim 1, wherein the O-ring is molded using an elastomeric polymer material that is compatible with a substrate to be supported.

4. The apparatus of claim 1, wherein the O-ring is used for supporting substrates during high speed handling and processing of the substrates.

5. The apparatus of claim 1, wherein the O-ring retains a supporting substrate by its frictional properties.

6. The apparatus of claim 1, wherein the recess has a dovetailed edge, and the dovetailed edge combined with the spherical hole prevents an O-ring from lifting with the substrate caused by stiction properties of elastomeric materials.

7. The apparatus of claim 1, wherein the upper surface of each strut is horizontally disposed below an upper surface of the O-ring.

8. An apparatus comprising:
    an O-ring structure having an upper surface and having at least two internally disposed struts, each strut extending to a centrally disposed sphere retainer, each strut having an upper surface and a lower surface, wherein the upper surface of each strut is formed below the upper surface of the O-ring; and
    said sphere retainer is formed so that it is connected to said struts, and wherein a lower portion of said sphere retainer extends below the lower surface of the struts.

9. The apparatus of claim 2, wherein the recess has a vent hole disposed therein, the vent hole being disposed between the spherical hole and the inside surface of the recess.

10. The apparatus of claim 8, wherein the O-ring is molded using an elastomeric polymer material that is compatible with a supported wafer.

11. The apparatus of claim 8, wherein the O-ring is adapted for supporting semiconductor wafers during high speed handling and processing of the wafers.

12. The apparatus of claim 8, wherein the O-ring is adapted to retain a supporting wafer by its frictional properties.

13. The apparatus of claim 8, wherein said sphere retainer in combination with the struts prevents the O-ring from lifting upwards with the wafer, and the lifting is caused by stiction properties of an elastomeric material.

14. A method for retaining the O-ring structure according to claim 1, comprising the steps of:
  providing a robot with a wafer-handling paddle;
  providing the wafer-handling paddle with a plurality of circular recesses, each circular recess contains and supports the O-ring structure pad, the circular recesses having a dovetailed periphery and a spherical hole disposed on its center, and a vent hole radially disposed halfway between the spherical hole and the inside surface of the circular recess;
  providing the O-ring structure; and
  placing the O-ring structure on each of the circular recesses while conforming the O-ring structure to the dovetailed periphery and removeably urging the sphere retainer into the spherical hole.

15. The method of claim 14 wherein the O-ring structures are molded using an elastomeric polymer material that is compatible with a supported wafer.

16. The method of claim 14 wherein the O-ring structure is used for supporting semiconductor wafers during high speed handling and processing of the wafers.

17. The method of claim 14 wherein the O-ring structure retains a supporting wafer by its frictional properties.

18. The method of claim 14 wherein the sphere-retainer in combination with the struts prevents the O-ring structure from lifting upwards with the wafer, the lifting being caused by stiction properties of an elastomeric material.

19. The method of claim 18, wherein a conventional O-ring stuck to the bottom of a wafer may be carried into a high temperature process chamber thus contaminating the process environment.

20. The method of claim 14 wherein the O-ring structure reduces processor downtime caused by contamination and substrate breakage resulting from a missing O-ring support.

21. The method of claim 14 wherein utilization of the O-ring structure is highly reliable and more serviceable equipment solution.

22. An apparatus comprising:
  an O-ring structure having an upper surface, a lower surface and a central axis, the upper surface configured to releasably support a substrate;
  a transfer paddle having a recess wall defining a recess, the recess configured to receive the O-ring structure;
  at least two struts disposed internally on the O-ring structure, each strut connected to the central axis of the O-ring structure, each strut having an upper surface and a lower surface; and
  a sphere retainer centrally disposed within the O-ring structure and connected to each of said struts, so that a lower portion of said sphere retainer extends below the lower surface of each strut.

23. The apparatus of claim 22, wherein the upper surface of each strut is horizontally disposed below the upper surface of the O-ring structure.

24. The apparatus of claim 22, wherein the recess of the transfer paddle has a spherical shape for supporting and containing the O-ring structure.

25. The apparatus of claim 22, wherein the recess wall of the transfer paddle is configured with a dovetailed edge for preventing the O-ring structure from lifting with a substrate during a transfer of the substrate from the apparatus to a substrate transport device.

26. The apparatus of claim 22, wherein the recess of the transfer paddle has a spherical hole centrally disposed therein, the spherical hole configured for the removable insertion of said lower portion of said sphere retainer.

27. The apparatus of claim 26, wherein the recess of the transfer paddle has a vent hole disposed therein, the vent hole being disposed between the spherical hole and the recess wall.

28. The apparatus of claim 22, wherein the O-ring structure is made of an elastomeric polymer material that is compatible with a substrate to be supported.

29. The apparatus of claim 22, wherein the O-ring structure is adapted to retain a supported substrate by its frictional properties.

* * * * *